(12) United States Patent
Mao

(10) Patent No.: US 12,035,500 B2
(45) Date of Patent: Jul. 9, 2024

(54) CAGE ASSEMBLY AND ELECTRONIC DEVICE INCLUDING THE SAME

(71) Applicant: WISTRON CORP., New Taipei (TW)

(72) Inventor: Zhong-Hui Mao, New Taipei (TW)

(73) Assignee: WISTRON CORP., New Taipei (TW)

( * ) Notice: Subject to any disclaimer, the term of this patent is extended or adjusted under 35 U.S.C. 154(b) by 286 days.

(21) Appl. No.: 17/841,749

(22) Filed: Jun. 16, 2022

(65) Prior Publication Data

US 2023/0301011 A1 Sep. 21, 2023

(30) Foreign Application Priority Data

Mar. 18, 2022 (CN) .......................... 202210267523.7

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | | |
|---|---|---|---|---|
| 6,010,345 A * | 1/2000 | Allen | ................... | H05K 7/1415 439/159 |
| 2012/0013233 A1 | 1/2012 | Chen et al. | | |
| 2013/0088831 A1 * | 4/2013 | Zheng | ................... | H05K 7/1422 361/679.43 |
| 2015/0131227 A1 * | 5/2015 | Howell | .................... | G06F 1/185 211/26 |
| 2015/0173217 A1 * | 6/2015 | Mao | ...................... | H05K 7/1411 312/332.1 |
| 2019/0138065 A1 * | 5/2019 | Chen | ....................... | G06F 1/185 |

FOREIGN PATENT DOCUMENTS

CN 102339102 A 2/2012

OTHER PUBLICATIONS

TW Office Action dated Oct. 19, 2022 in Taiwan application No. 111112150.

\* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A cage assembly is configured to be detachably cooperated with an engagement component having at least one through hole and at least one engagement portion. The cage assembly includes a main cage and a releasing component, the main cage includes at least one engaging structure configured to be inserted into the at least one through hole and engaged with the at least one engagement portion, and the releasing component is slidably disposed on the main cage and is configured to push the engagement component so as to force the at least one engagement portion to be released from the at least one engaging structure.

20 Claims, 13 Drawing Sheets

CAGE ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202210267523.7 filed in China on Mar. 18, 2022, the entire contents of which are hereby incorporated by reference.

TECHNICAL FIELD

The disclosure relates to a cage assembly and an electronic device including the same.

BACKGROUND

The artificial intelligence and deep learning are widely used in many fields, such as search engine, e-commerce, social media, finance, biomedicine, language learning. It is known that graphics processing units (GPU) can dramatically speed up computational processes for artificial intelligence and deep learning compared to central processing unit (CPU), thus the attention on the development of GPU is increasing in recent years. With this trend, servers that support GPU are also in a period of vigorous development.

Conventionally, a typical GPU is fixed in, for example, a server housing, via screws or bolts arranged at the tail of the cage thereof; however, the use of screws and bolts does not facilitate the maintenance, installation, and removal of GPU. Also, in the cases that the GPU is heavy and large in size, screws or bolts merely on the tail of the cage are unable to secure the position of the GPU. Understandably, other expansion cards that are heavy in weight and large in size might face similar problems if their fixation merely rely on the screws or bolts on a single side of their cages.

SUMMARY

Accordingly, one aspect of the disclosure is to provide a cage assembly and an electronic device including the same which enable installation and removal of function unit without the use of any additional tool.

One embodiment of the disclosure provides a cage assembly configured to be detachably cooperated with an engagement component having at least one through hole and at least one engagement portion. The cage assembly includes a main cage and a releasing component, the main cage includes at least one engaging structure configured to be inserted into the at least one through hole and engaged with the at least one engagement portion, and the releasing component is slidably disposed on the main cage and is configured to push the engagement component so as to force the at least one engagement portion to be released from the at least one engaging structure.

One embodiment of the disclosure provides an electronic device including a housing, an engagement component, and at least one cage assembly, the housing includes two sidewalls and a bridge component, the two sidewalls are located opposite to each other, two opposite ends of the bridge component are respectively connected to the two sidewalls, the engagement component is slidably disposed on the bridge component, the engagement component has at least one through hole and at least one engagement portion, the at least one cage assembly is detachably disposed on the housing and includes a main cage and a releasing component, the main cage includes at least one engaging structure configured to be engaged with the engagement component so as to position the main cage to the bridge component, and the releasing component is slidably disposed on the main cage and is configured to push the engagement component so as to release the at least one cage assembly from the housing.

According to the cage assembly and electronic device as discussed in the above embodiments of the disclosure, the main cage has at least one engaging structure removably inserted into the through hole of the engagement component and releasably engaged with the engagement portion of the engagement component, thus the cage assembly can be easily installed in, for example, a server housing, using its engaging structure. Also, the main cage has a releasing component slidable to release the engaging structure from the engagement component, which allows the user to easily cancel the limitation of the engagement component to the cage assembly by one push of the releasing component. Therefore, the installation and removal of the cage assembly of the disclosure can be implemented without the use of addition tool.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
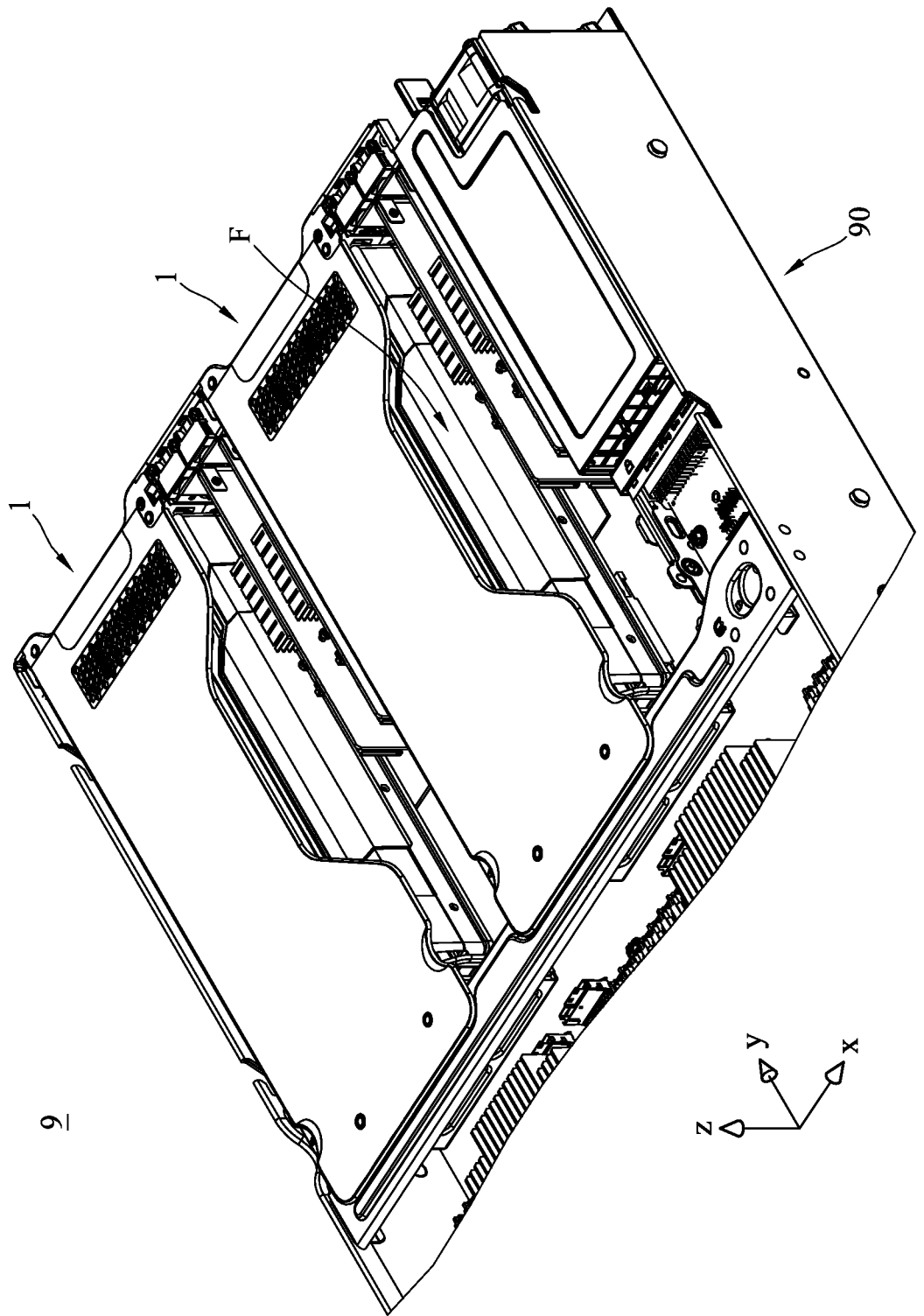
FIG. 1 is a partially-enlarged perspective view of an electronic device according to one embodiment of the disclosure.
Figure 2:
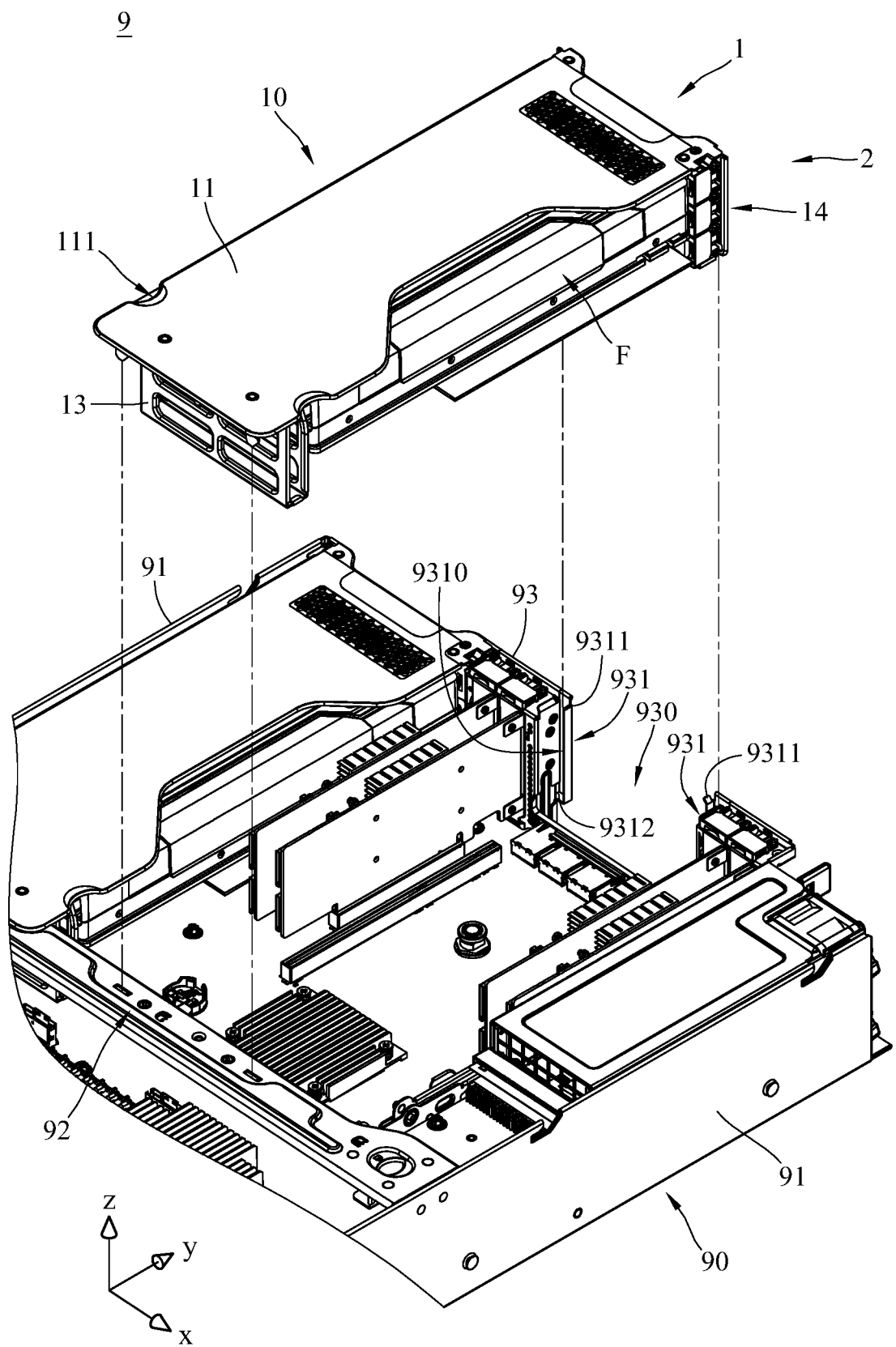
FIG. 2 is an exploded view of a cage assembly and a housing in FIG. 1.
Figure 3:
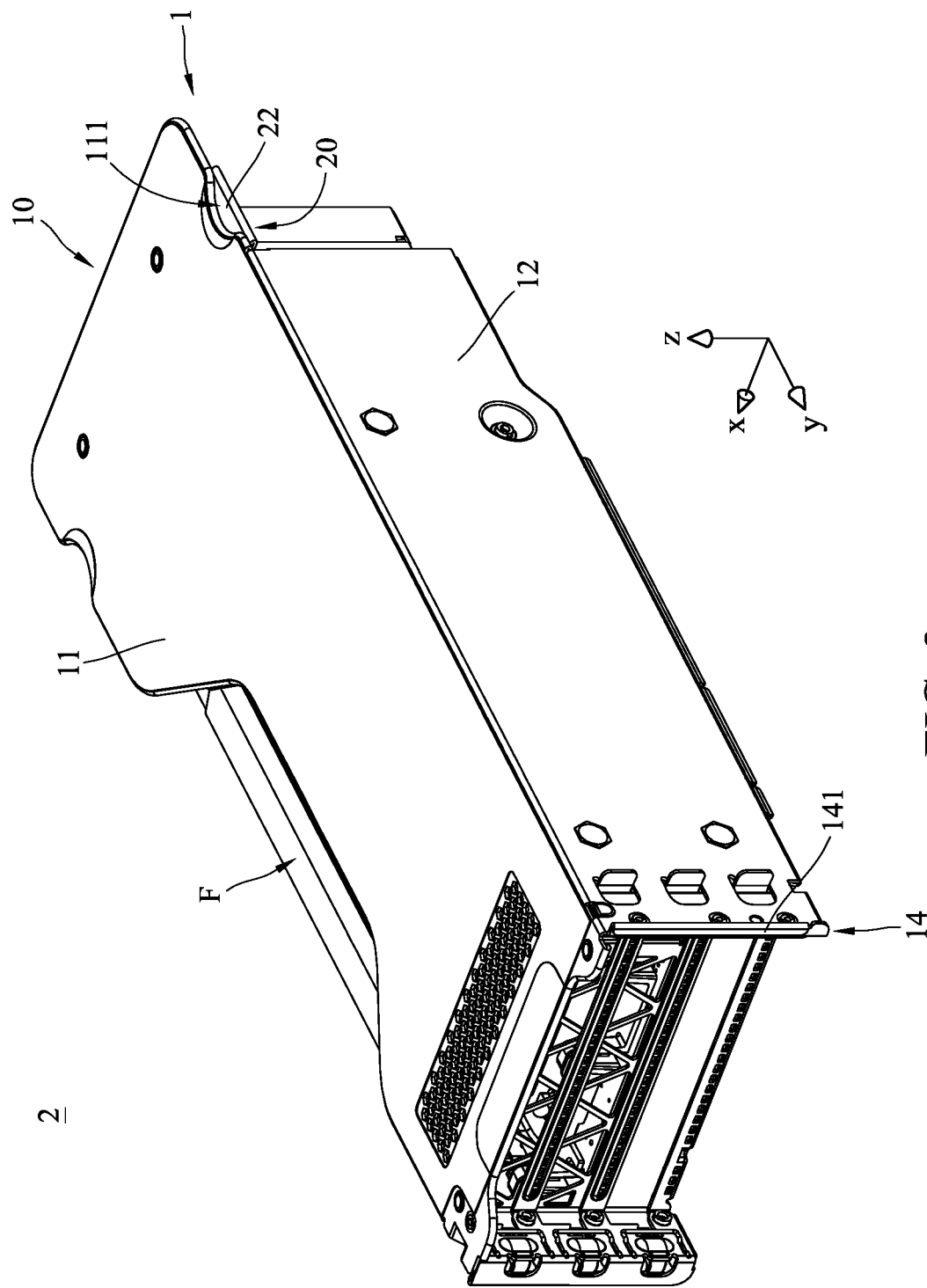
FIGS. 3-4 are perspective views of the cage assembly in FIG. 2 taken in different viewpoints.
Figure 4:
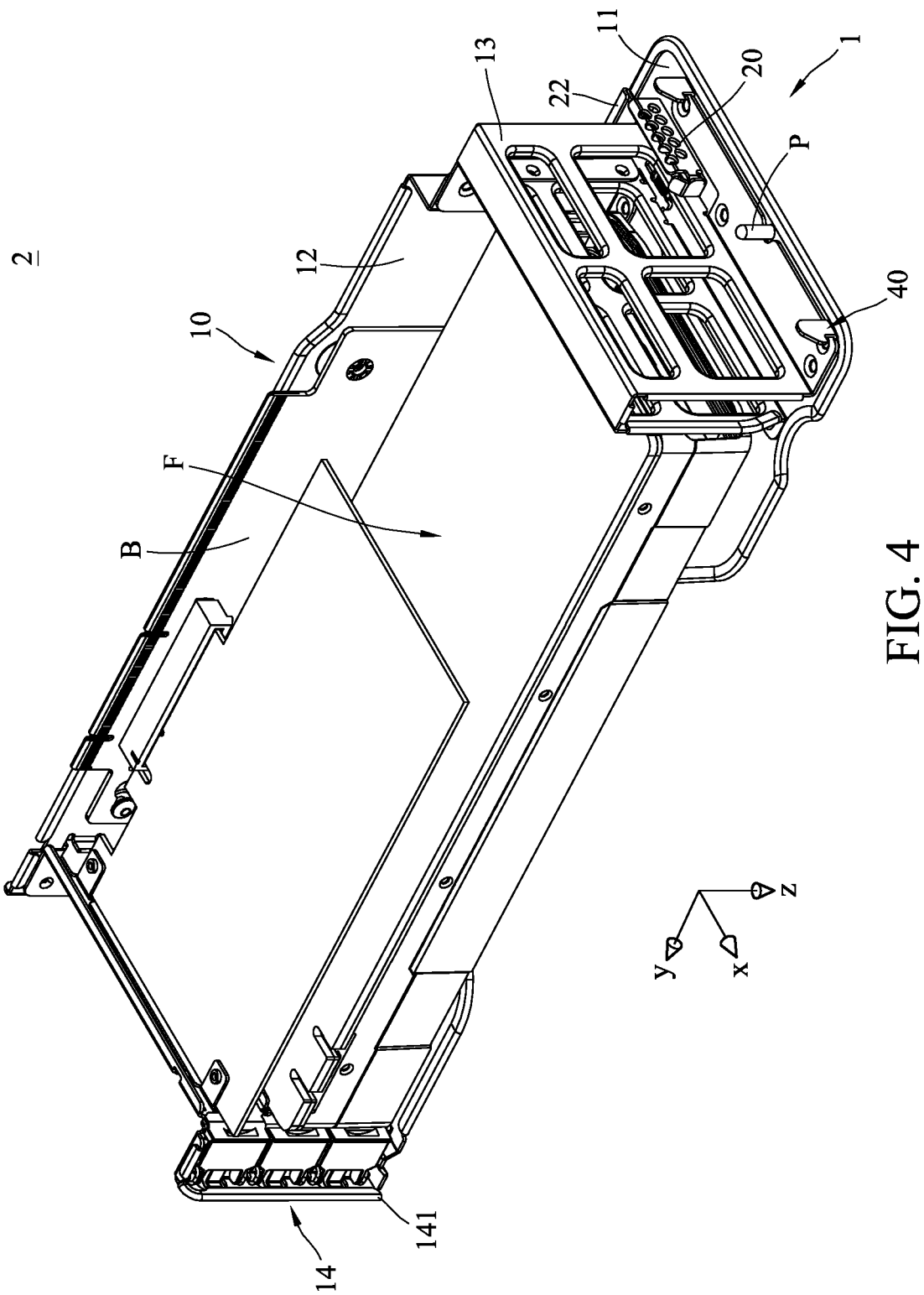
Figure 5:
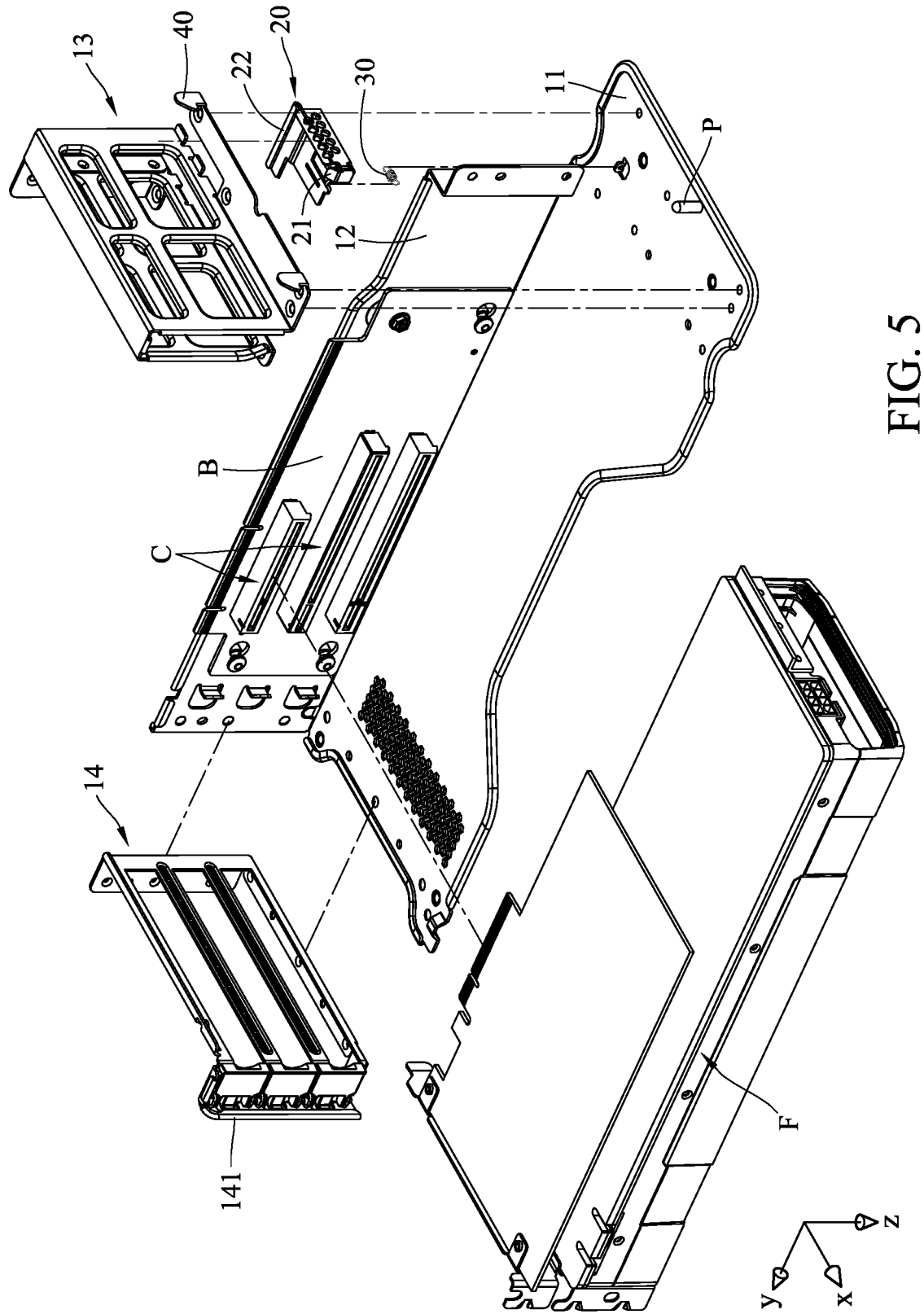
FIG. 5 is an exploded view of the cage assembly in FIG. 2.
Figure 6:
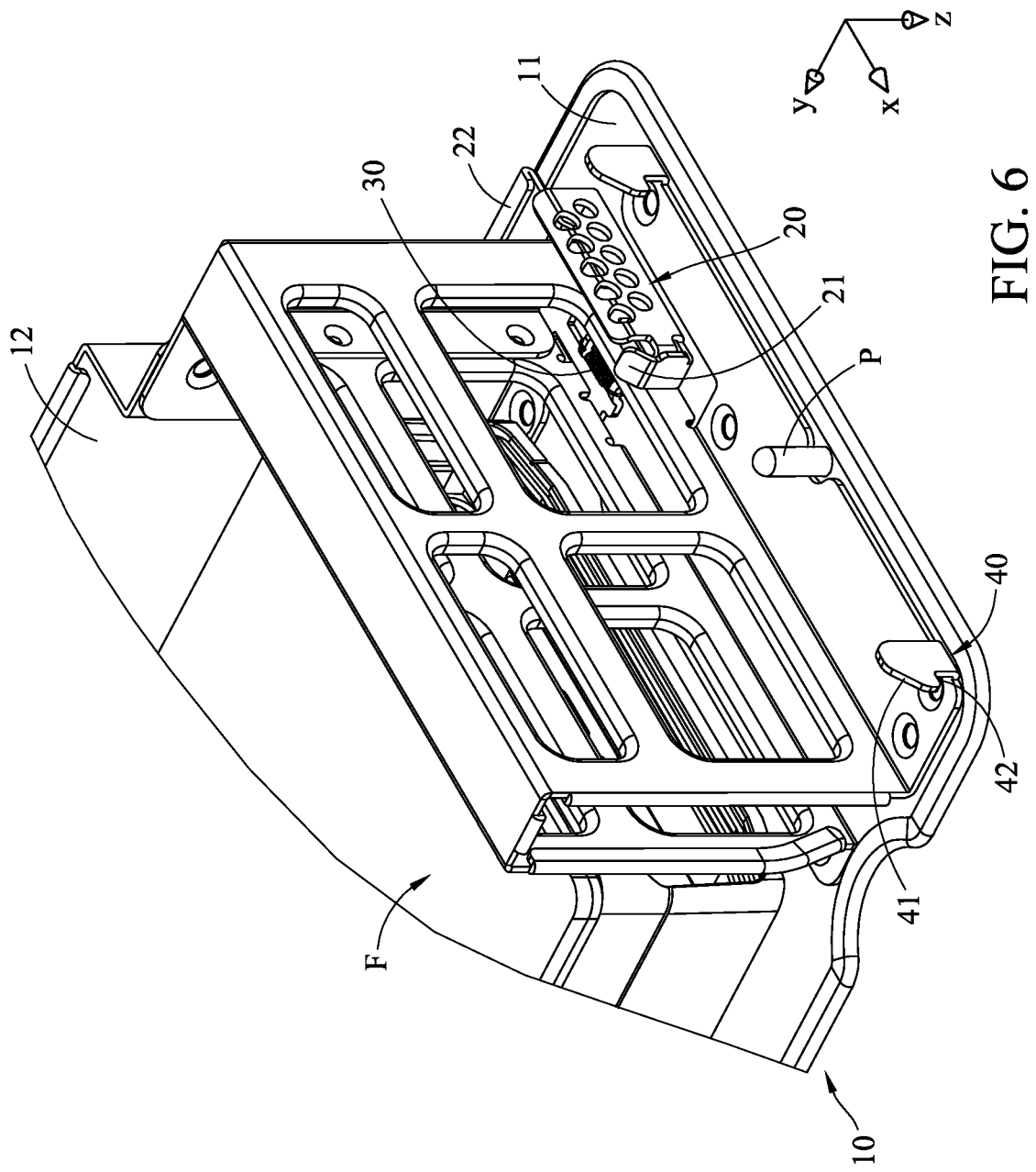
FIG. 6 is a partially-enlarged perspective view of the cage assembly in FIG. 2.

Firstly, referring to FIGS. 1-2, one embodiment of the disclosure provides an electronic device 9. The electronic device 9 is, for example, a server or part of a server. The electronic device 9 may include a housing 90 configured to accommodate at least one cage assembly 1. The housing 90 may include two sidewalls 91, a bridge component 92, and a rear wall 93. The sidewalls 91 are located opposite to each other and are respectively arranged at two opposite sides of the housing 90, two opposite ends of the bridge component 92 are respectively connected to the sidewalls 91, and the rear wall 93 is arranged at the same side of the sidewalls 91 and connected between the sidewalls 91. As shown, the sidewalls 91 and the rear wall 93 are served as walls respectively located at three adjacent sides of the housing 90. The bridge component 92 is connected to the sidewalls 91 and may be spaced apart from the rear wall 93. At least one cage assembly 1 is configured to be arranged in the area defined by the sidewalls 91, the bridge component 92, and the rear wall 93.

The cage assembly 1 is configured to support or accommodate at least one function unit F. The function unit F may be served as an expansion module. For example, the function unit F is a graphics processing unit (GPU) or other units compatible for peripheral component interconnect express (PCIe). As shown, the cage assembly 1 and the function unit F thereon may be together employed as an expansion module 2, such that users are allowed to add required functions to the housing 90 using the cage assembly 1.

Please further refer to FIGS. 3-7. In this embodiment, the cage assembly 1 may include a main cage 10. The main cage 10 may include a first support portion 11, a second support portion 12, a third support portion 13, and a guide structure 14. The first support portion 11 and the second support portion 12 may be two plates connected to each other, where the first support portion 11 may be at a required angle to the second support portion 12. For example, the second support portion 12 may be perpendicular to the first support portion 11 so that the first support portion 11 and the second support portion 12 may together form a L-shaped structure for supporting or accommodating the function unit F. Optionally, in this embodiment, there may be a riser card B disposed on the main cage 10; in specific, the riser card B may be disposed on the second support portion 12 of the main cage 10, the riser card B is configured to be electrically connected to a mainboard (not shown) arranged on the housing 90, and the riser card B may have one or more connectors C thereon used to be electrically connected to the function unit F accommodated within the main cage 10. As such, the function unit F can be electrically connected to the mainboard on the housing 90 via the riser card B.

The second support portion 12, the third support portion 13, and the guide structure 14 are respectively located at different sides of the first support portion 11. In specific, as shown, the guide structure 14 and the third support portion 13 are respectively located adjacent to two opposite sides of the first support portion 11, the third support portion 13 and the guide structure 14 are respectively located adjacent to two different sides of the second support portion 12, and the second support portion 12, the third support portion 13, and the guide structure 14 may be respectively located adjacent to three adjacent sides of the first support portion 11. As shown, the first support portion 11, the second support portion 12, the third support portion 13, and the guide structure 14 may together define a space suitable for accommodating at least one function unit F. Optionally, the guide structure 14 is configured to be engaged with a baffle (not numbered) of the function unit F so as to secure the position of the function unit F relative to the main cage 10.

In addition, the guide structure 14 may be configured to guide and position the cage assembly 1 during the installation of the cage assembly 1 onto the housing 90 and the removal of the cage assembly 1 from the housing 90. Specifically, the guide structure 14 may include at least one guiding portion 141. For example, the guide structure 14 includes two guiding portions 141 respectively located at two opposite sides of the guide structure 14. The rear wall 93 may have at least one receiving space 930 configured to receive the guide structures 14 when the cage assembly 1 is accommodated in the housing 90. The rear wall 93 may include at least one guiding structure 931. For example, the rear wall 93 has two guiding structures 931 respectively located at two opposite sides of the receiving space 930. In this embodiment, each guiding structure 931 may define a groove 9310 mating the guiding portion 141 of the guide structure 14, thus the guiding portions 141 can be removably inserted into the grooves 9310 so as to guide and position the cage assembly 1 relative to the housing 90.

Optionally, the guiding structure 931 may include at least one entrance guide 9311 arranged at the opening of the groove 9310 and inclined relative to the groove 9310, the entrance guide 9311 is configured to facilitate the insertion of the guiding portion 141 into the groove 9310. In addition, optionally, the guiding structure 931 may include a stopping portion 9312 located at an end opposite to the opening of the groove 9310, the stopping portion 9312 is configured to stop the cage assembly 1 at a specific position.

The cage assembly 1 may include a releasing component 20, a guide post P, and at least one engaging structure 40 for another end of the main cage 10 opposite to the guide structure 14 to be engaged with the bridge component 92. Details are given below.

Figure 9:
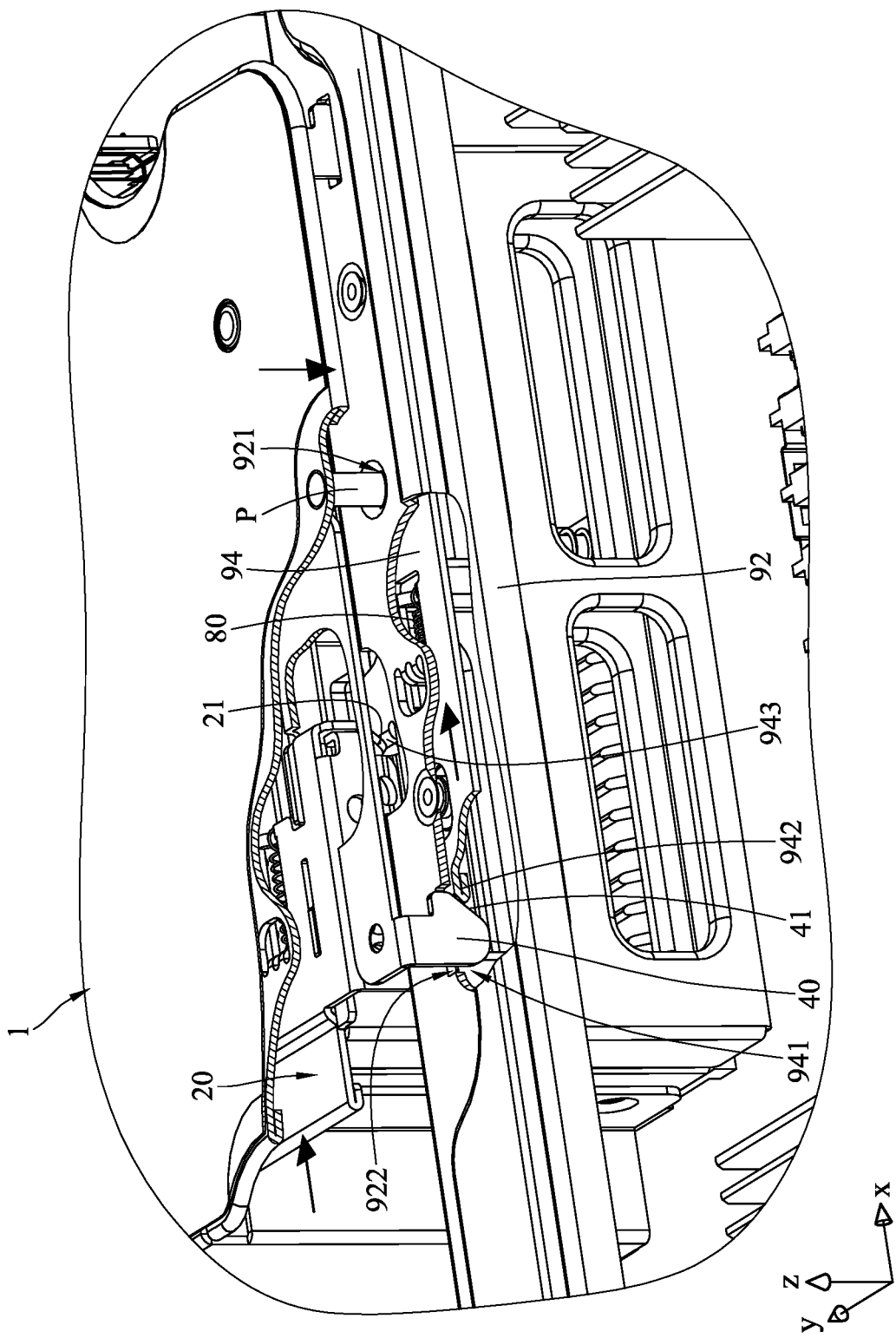
FIGS. 9-10 depict the operation of installing the cage assembly to the housing.
Figure 11:
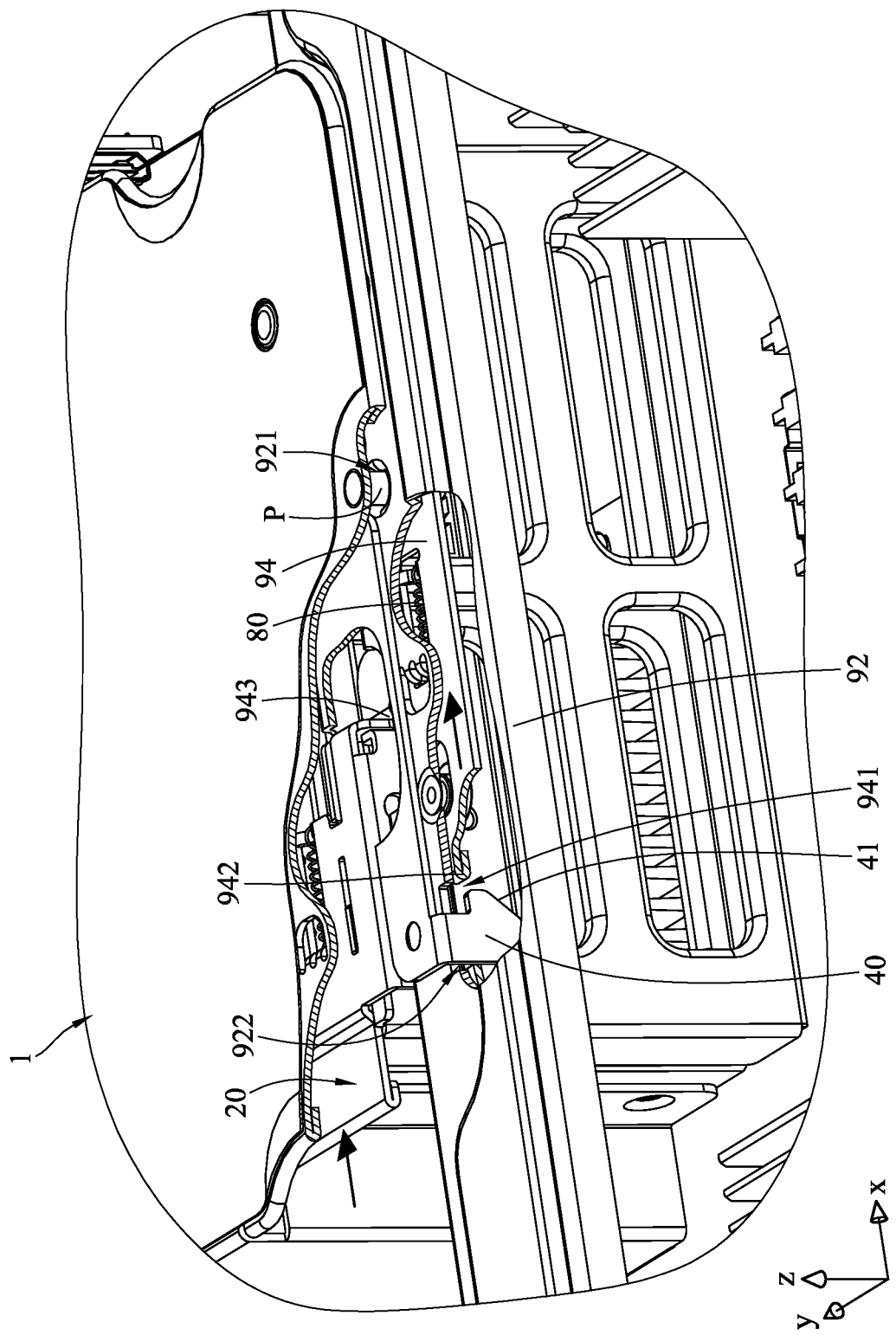
FIG. 11 depicts the operation of releasing the cage assembly.

The releasing component 20 is slidably disposed on the main cage 10. For example, the releasing component 20 is slidably disposed on the first support portion 11 of the main cage 10 and may be arranged adjacent to the third support portion 13; in other words, the releasing component 20 and the guide structure 14 are respectively arranged adjacent to two opposite ends of the first support portion 11. As shown, the releasing component 20, the second support portion 12, and the guide structure 14 are respectively located at different sides of the first support portion 11. Herein, the releasing component 20 is slidable relative to the first support portion 11 and therefore have an original position (as shown in FIG. 1) and a pushed position (as shown in FIG. 9 or FIG. 11). The releasing component 20 may have a pushing portion 21 and an operative portion 22 respectively located at two opposite ends of the releasing component 20. The pushing portion 21 may be a surface inclined relative to a slidable direction of the releasing component 20.

Optionally, the first support portion 11 may have a notch 111; when the releasing component 20 is in the original position, the notch 111 exposes the operative portion 22 so that user is allowed to operate the releasing component 20 by pushing the operative portion 22.

In addition, optionally, there is a first restoring component 30 connected to and located between the releasing component 20 and the main cage 10. In specific, the first restoring component 30 may be connected between the releasing component 20 and the first support portion 11 of the main cage 10. The first restoring component 30 may be any typical extension spring and therefore is able to force the releasing component 20 to move toward the original position.

The guide post P protrudes from the main cage 10. For example, the guide post P protrudes from an inner surface of the first support portion 11 of the main cage 10 and may be located opposite to the guide structure 14. The engaging structure 40 protrudes from the main cage 10. For example, the engaging structure 40 protrudes from the inner surface of the first support portion 11 of the main cage 10 and may be located adjacent to the third support portion 13; in other words, the engaging structure 40 and the guide structure 14 are respectively located at two opposite sides of the first support portion 11. The engaging structure 40 may include a contact portion 41 and a holding portion 42, the contact portion 41 may be an inclined surface located at an end of the engaging structure 40 away from the first support portion 11, and the holding portion 42 may be a flat surface located between the contact portion 41 and the first support portion 11 and facing toward the first support portion 11.

Figure 7:
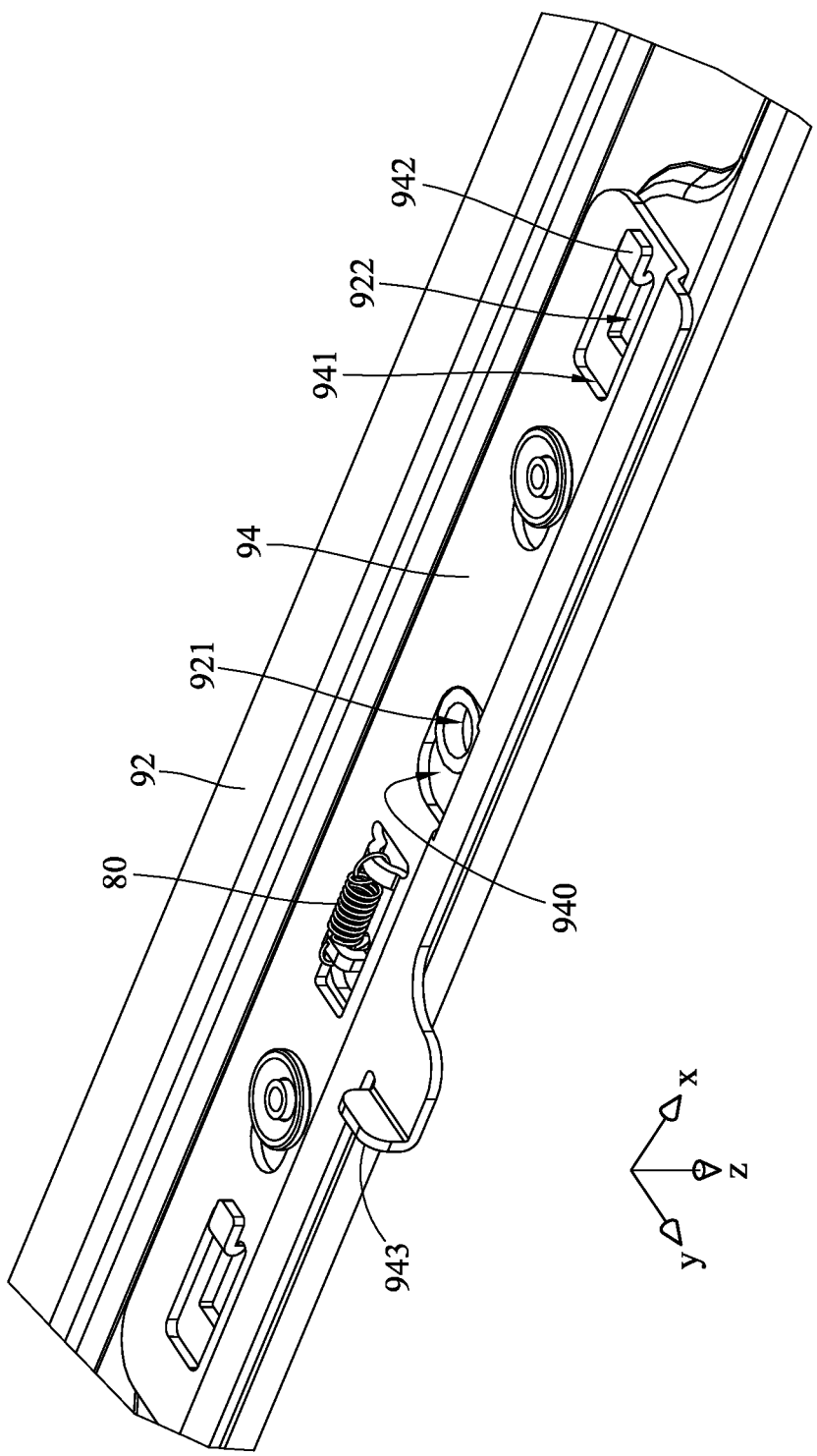
FIG. 7 is a partially-enlarged perspective view of the housing in FIG. 2.
Figure 10:
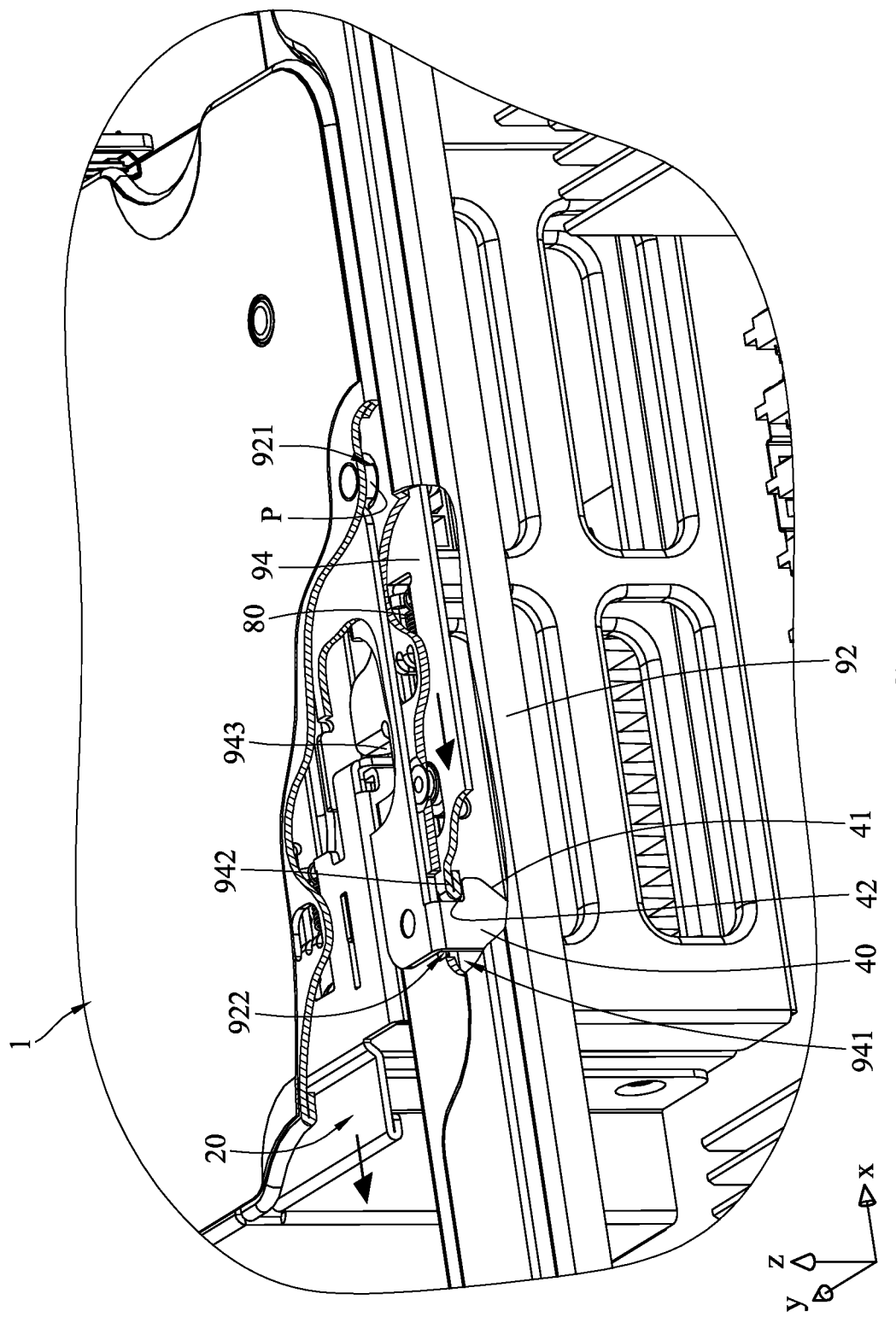

With respect to the releasing component 20, the guide post P, and the engaging structure 40 on the cage assembly 1, the bridge component 92 may include an engagement component 94 thereon. The engagement component 94 is slidably disposed on the bridge component 92 and therefore has a released position (as shown in FIG. 9 or FIG. 11) and an engaged position (as shown in FIG. 7 or FIG. 10). The cage assembly 1 is configured to be detachably cooperated with the engagement component 94. In specific, the engagement component 94 is configured to be engaged with the engaging structure 40 and movable with the releasing component 20. The bridge component 92 may have at least one positioning hole 921, the engagement component 94 may have at least one groove 940, the positioning hole 921 corresponds to the groove 940 and is configured for the insertion of the guide post P so as to guide the cage assembly 1 during the installation and removal of the cage assembly 1. The bridge component 92 may further have at least one through hole 922, the engagement component 94 may further have a through hole 941 corresponding to the through hole 922, the through hole 922 and the through hole 941 are configured for the insertion of the engaging structure 40. The engagement component 94 may further have at least one engagement portion 942 located at an end of the through hole 941; when the engagement component 94 is in the released position, the engagement portion 942 is exposed from the through hole 922 and located at the path of the engaging structure 40 and therefore then can be engaged with the engaging structure 40.

In this embodiment, the engagement component 94 may have a pushed portion 943 configured to contact the releasing component 20. The releasing component 20 is configured to push the pushed portion 943 so as to force the engagement component 94 to move toward the released position from the engaged position. Optionally, there may be a second restoring component 80 connected to and located between the bridge component 92 and the engagement component 94. The second restoring component 80 may be any typical extension spring and therefore is able to force the engagement component 94 to move toward the engaged position.

Figure 8:
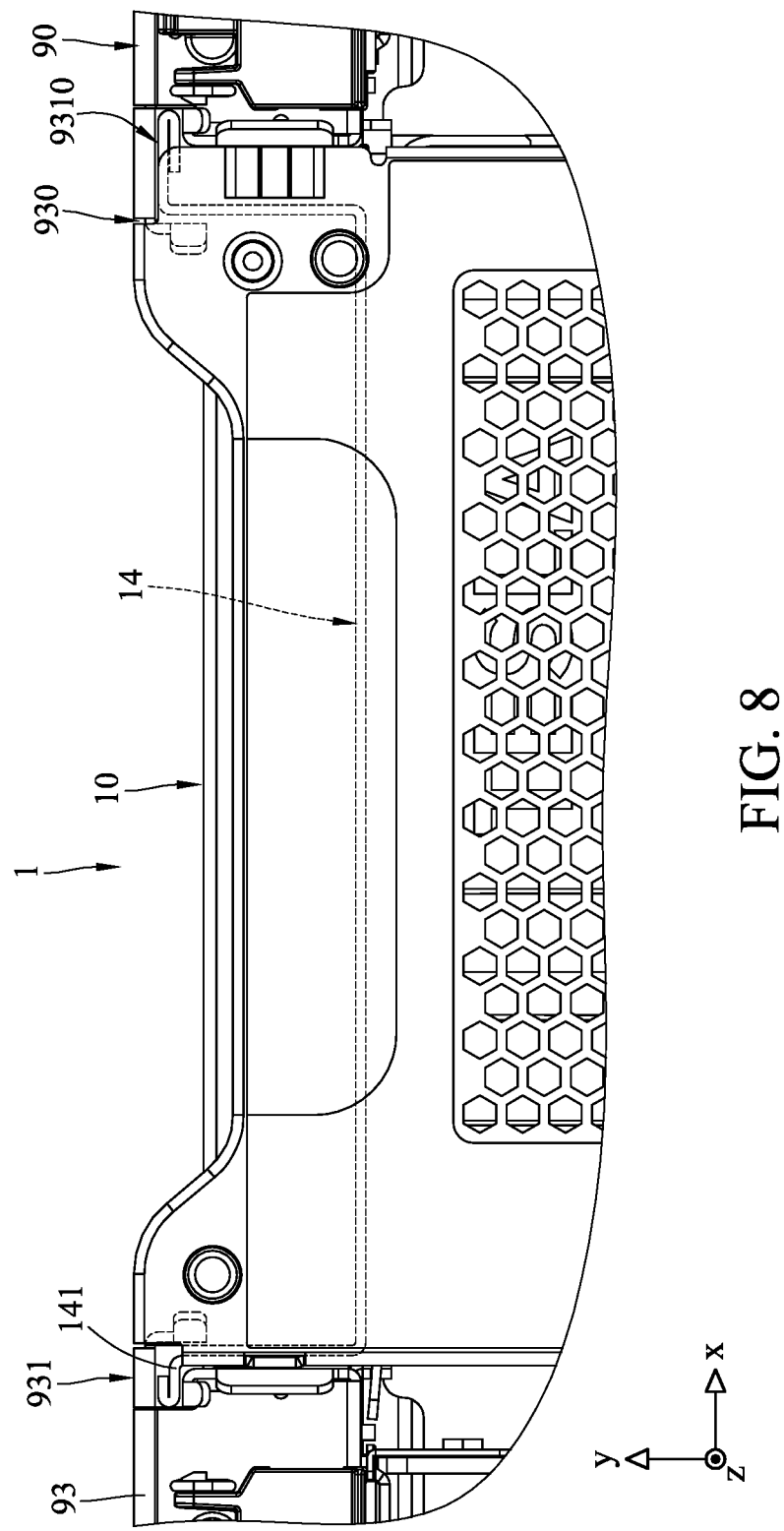
FIG. 8 is a partially-enlarged top view of the electronic device in FIG. 1 when the cage assembly is installed on the housing.

The installation and removal of the cage assembly 1 are introduced hereinafter with further reference to FIGS. 8-11. Firstly, to place one of the cage assemblies 1 into the housing 90 as depicted in FIG. 2, the guide structure 14 of the main cage 10 of the cage assembly 1 can be inserted into the receiving space 930 at the rear wall 93 of the housing 90 as shown in FIG. 8. By doing so, the guiding portions 141 of the guide structure 14 can be inserted into the grooves 9310 defined by the guiding structures 931 at two opposite sides of the receiving space 930. During the insertion, the cooperation of the guiding portions 141 and the grooves 9310 ensures that the cage assembly 1 is placed into the housing 90 along a predetermined direction. Also, the entrance guides 9311 at the openings of the grooves 9310 facilitate the insertions of the guiding portions 141 into the grooves 9310.

Meanwhile, as shown in FIG. 9, while the main cage 10 of the cage assembly 1 is moved along the grooves 9310 of the housing 90, the guide post P on the cage assembly 1 is inserted into the positioning hole 921 of the bridge component 92, which also can ensure that the cage assembly 1 is placed into the housing 90 along the predetermined direction. Therefore, the guide structure 14 and the guide post P are able to ensure that two opposite ends of the cage assembly 1 can be placed into the housing 90 in the predetermined direction.

During the placement, the engaging structure 40 is inserted into the through hole 922 of the bridge component 92, and the contact portion 41 thereof pushes the engagement portion 942 of the engagement component 94 exposed from the through hole 922. Since the contact portion 41 is an inclined surface, the contact portion 41 is able to apply a force in a direction toward the released position on the engagement portion 942; as such, the contact portion 41 can cause the engagement component 94 to move toward the released position by pushing the engagement portion 942, such that the engaging structure 40 is allowed to penetrate through the through hole 922 and enters into the through hole 941 of the engagement component 94.

In addition, during the placement of the cage assembly 1 into the housing 90, the user is allowed to push the operative portion 22 of the releasing component 20 exposed from the notch 111 of the first support portion 11 of the main cage 10 so as to move the releasing component 20 to the pushed position. By doing so, the pushing portion 21 of the releasing component 20 can push the pushed portion 943 of the engagement component 94 so as to secure the engagement component 94 to be the released position, thereby ensuring that the engaging structure 40 can be disposed through the through hole 922 and entering the through hole 941 of the engagement component 94 during the placement of the cage assembly 1 into the housing 90.

Then, as the cage assembly 1 is further placed into the housing 90, the stopping portions 9312 at the ends of the grooves 9310 can stop the guiding portions 141 to let user aware that the cage assembly 1 reaches the required position. Then, in FIG. 10, the releasing component 20 can be released, such that the aforementioned first restoring component 30 can automatically restore the releasing component 20 back to the original position, and the engagement component 94 will be not limited by the releasing component and can be automatically restored back to the engaged position by the second restoring component 80. As indicated by the arrows, the engagement portion 942 is moved towards the engaging structure 40 and engaged with the holding portion 42 of the engaging structure so as to fix the cage assembly 1 to the bridge component 92. As discussed, one end of the cage assembly 1 can be fixed in position via the cooperation of the guiding portions 141 of the main cage 10 and the grooves 9310 of the housing 90, and the other end of the cage assembly 1 can be fixed in position via the cooperation of the engaging structure 40 and the engagement component 94, such that the cage assembly 1 is firmly installed on the housing 90 without the use of additional tools.

Regarding the removal of the cage assembly 1, as the arrows indicated in FIG. 11, the releasing component 20 is moved to the pushed position when the user pushes the operative portion 22, such that the releasing component 20 pushes the pushed portion 943 of the engagement component 94 so as to force the engagement component 94 to move toward the released position. By doing so, the engagement portion 942 is released from the holding portion 42 of the engaging structure 40, such that the limitation of the engagement component 94 to the cage assembly 1 is canceled and thus allowing the user to remove the cage assembly 1 out of the housing 90.

Figure 12:
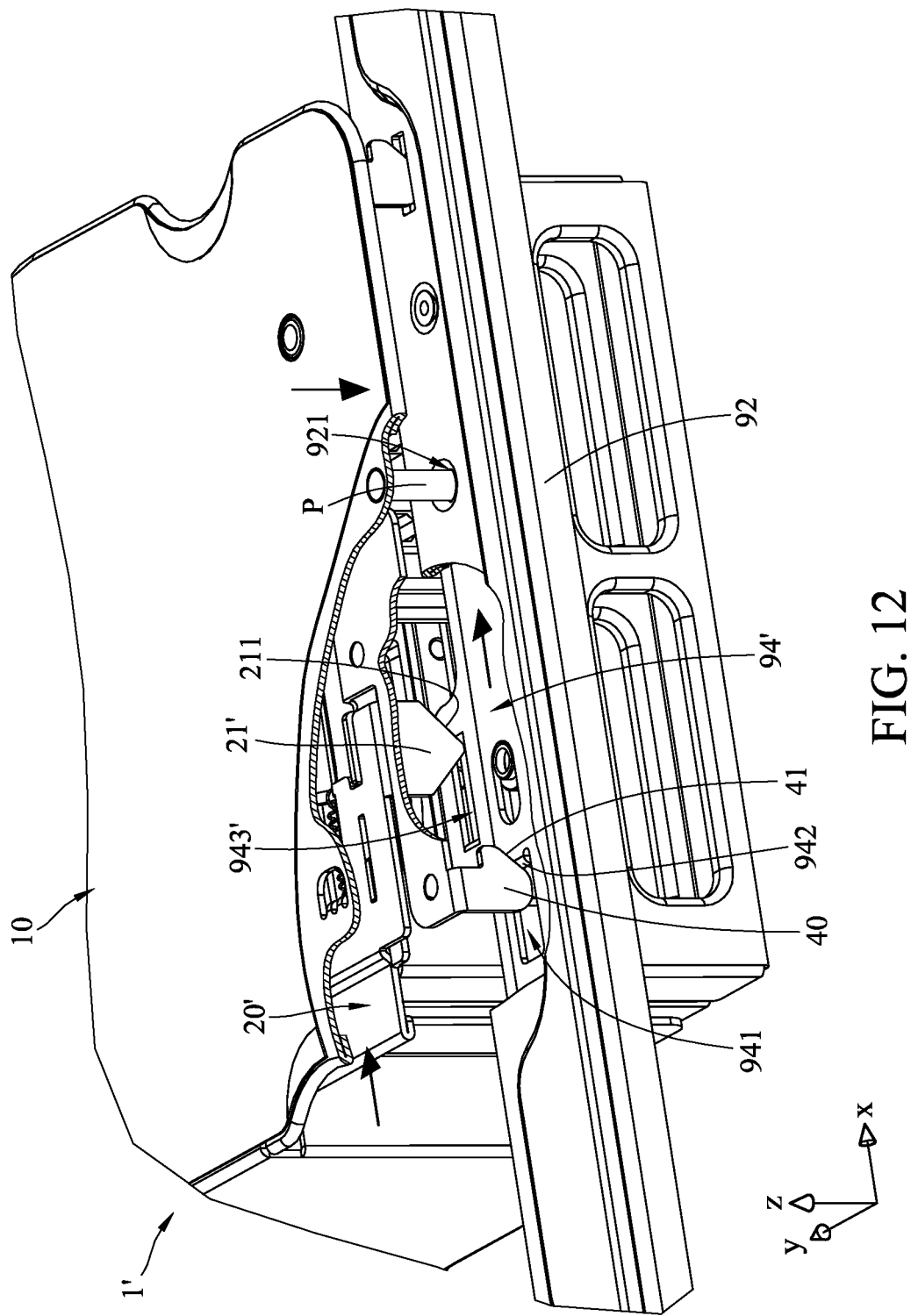
FIGS. 12-13 depict the operation of installing a cage assembly of an electronic device according to another embodiment of the disclosure to the housing.
Figure 13:
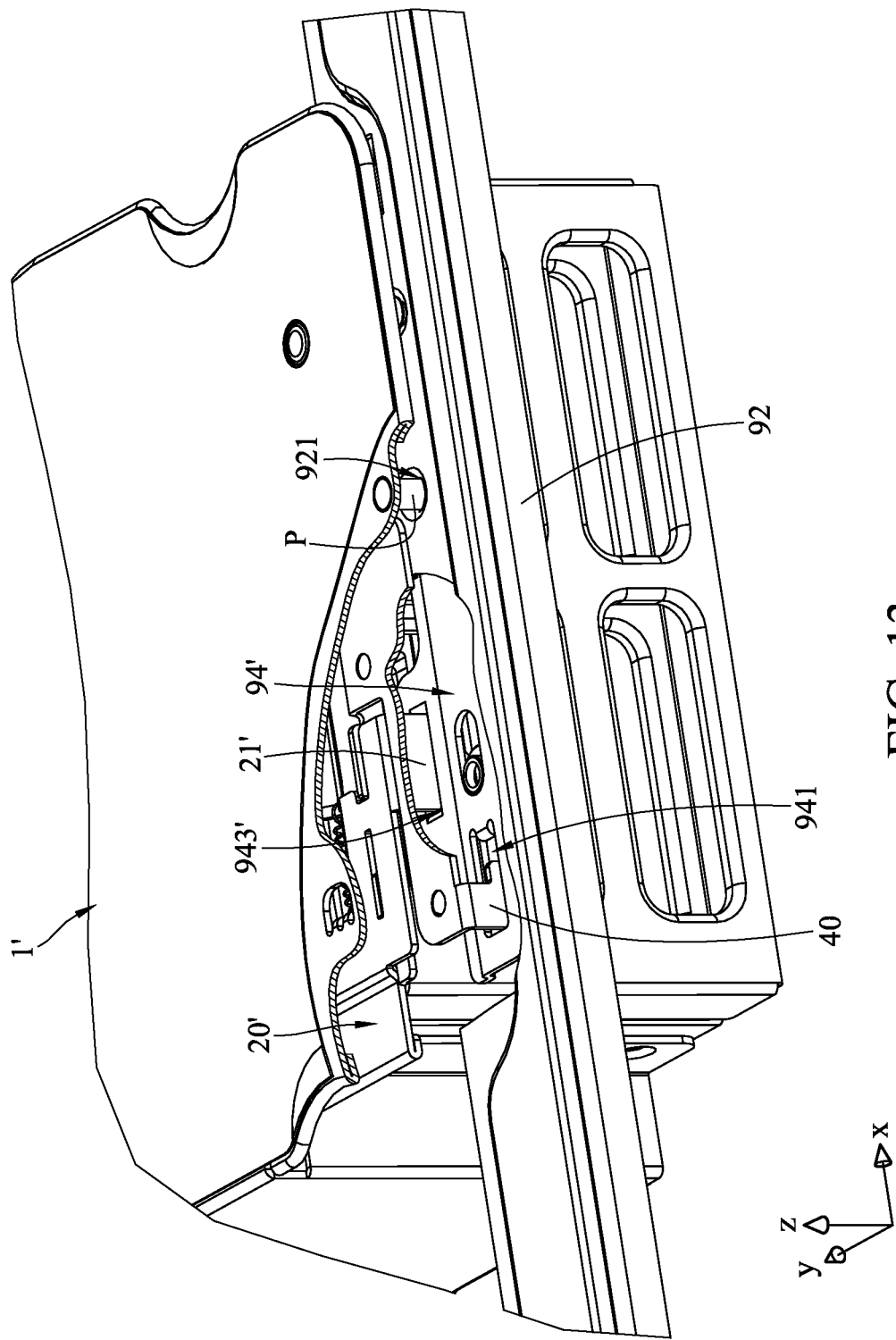

It is noted that the cage assembly and the engagement component as discussed in the previous embodiments are exemplary but not intended to limit the disclosure. Please see FIGS. 12-13, another embodiment of the disclosure provides a cage assembly 1', the differences between the cage assembly 1' and the cage assembly of the previous embodiments at mainly at the designs of the releasing component and the engagement component.

As shown, in the cage assembly 1', a pushing portion 21' of a releasing component 20' may be a protrusion while a pushed portion 943' of an engagement component 94' is a through hole suitable for the insertion of the pushing portion 21'. In such an arrangement, the user is also able to push the releasing component 20' to the pushed position to facilitate the installation of the cage assembly 1', and the pushing portion 21' can be inserted into the pushed portion 943' during the placement of the cage assembly 1'. As shown, the pushing portion 21' has an inclined push surface 211 configured to push the pushed portion 943' so as to cause the engagement component 94' to move toward the released position, thus the engaging structure 40 is ensured to enter the through hole 941 of the engagement component 94'. Then, in FIG. 13, before releasing the releasing component 20', the engagement component 94' can be kept in the released position by the pushing portion 21'. Then, when the cage assembly 1' is installed in position, releasing the releasing component 20' back to the original position can bring the engagement component 94' back to the engaged position so as to cause the engagement component 94' to engage with the engaging structure 40.

It is also noted that the cage assembly can be further modified according to actual requirements. In some other embodiments, the main cage may omit the third support portion; in another embodiment, the releasing component or the engagement component may omit restoring component and can be operated in manual manner; in another embodiment, the main cage may omit the guide structure; in another embodiment, the cage assembly may include a required number of engaging structure arranged at two opposite sides the main cage.

According to the cage assembly and the electronic device as discussed in the above embodiments of the disclosure, the main cage has at least one engaging structure removably inserted into the through hole of the engagement component and releasably engaged with the engagement portion of the engagement component, thus the cage assembly can be easily installed in, for example, a server housing, using its engaging structure. Also, the main cage has a releasing component slidable to release the engaging structure from the engagement component, which allows the user to easily cancel the limitation of the engagement component to the cage assembly by one push of the releasing component. Therefore, the installation and removal of the cage assembly of the disclosure can be implemented without the use of additional tools.

In addition, the other end of the main cage can be fixed in position by inserting the guiding portion of the guide structure into the groove at the rear wall of the housing. As such, the front and rear ends of the cage assembly both can be installed and removed without the use of any additional tool. This facilitates to ensure the reliability and stability of heavy and larger sized function units (e.g., GPU) on the cage assembly.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A cage assembly, configured to be detachably cooperated with an engagement component having at least one through hole and at least one engagement portion, comprising:
   a main cage comprising at least one engaging structure, wherein the at least one engaging structure is configured to be inserted into the at least one through hole and engaged with the at least one engagement portion; and
   a releasing component slidably disposed on the main cage, wherein the releasing component is configured to push the engagement component so as to force the at least one engagement portion to be released from the at least one engaging structure.

2. The cage assembly according to claim 1, further comprising a first restoring component connected to and located between the releasing component and the main cage.

3. The cage assembly according to claim 1, wherein the releasing component comprises a pushing portion being a surface inclined relative to a slidable direction of the releasing component.

4. The cage assembly according to claim 3, wherein the main cage has a notch, the releasing component comprises a operative portion, the pushing portion and the operative portion are respectively located at two opposite ends of the releasing component; when the releasing component is in an original position, the operative portion is exposed from the notch.

5. The cage assembly according to claim 1, wherein the engaging structure comprises a contact portion and a holding portion, the contact portion is an inclined surface located at an end of the engaging structure located away from the main cage, the holding portion is a flat surface located between the contact portion and the main cage and facing toward the main cage, the contact portion is configured to contact the at least one engagement portion of the engagement component, and the holding portion is configured to engage with the at least one engagement portion of the engagement component.

6. The cage assembly according to claim 1, wherein the main cage comprises a first support portion, a second support portion, and a guide structure, the releasing component is slidably disposed on the first support portion, the at least one engaging structure protrudes from the first support portion, the at least one engaging structure, the second support portion, and the guide structure are respectively located at different sides of the first support portion, and the at least one engaging structure and the guide structure are located opposite to each other.

7. The cage assembly according to claim 6, further comprising a guide post protruding from the first support portion of the main cage, wherein the guide post and the guide structure are located opposite to each other.

8. The cage assembly according to claim 6, further comprising a riser card disposed on the second support portion.

9. An electronic device, comprising:
a housing comprising two sidewalls and a bridge component, wherein the two sidewalls are located opposite to each other, and two opposite ends of the bridge component are respectively connected to the two sidewalls;
an engagement component slidably disposed on the bridge component, wherein the engagement component has at least one through hole and at least one engagement portion; and
at least one cage assembly detachably disposed on the housing and comprising:
a main cage comprising at least one engaging structure, wherein the at least one engaging structure is configured to be engaged with the engagement component so as to position the main cage to the bridge component; and
a releasing component slidably disposed on the main cage, wherein the releasing component is configured to push the engagement component so as to release the at least one cage assembly from the housing.

10. The electronic device according to claim 9, wherein the cage assembly further comprises a first restoring component connected to and located between the releasing component and the main cage.

11. The electronic device according to claim 9, wherein the releasing component comprises a pushing portion being a surface inclined relative to a slidable direction of the releasing component and configured to contact a pushed portion of the engagement component.

12. The electronic device according to claim 11, wherein the main cage has a notch, the releasing component comprises a operative portion, the pushing portion and the operative portion are respectively located at two opposite ends of the releasing component; when the releasing component is in an original position, the operative portion is exposed from the notch.

13. The electronic device according to claim 9, wherein the engaging structure comprises a contact portion and a holding portion, the contact portion is an inclined surface located at an end of the engaging structure located away from the main cage, the holding portion is a flat surface located between the contact portion and the main cage and facing toward the main cage, the contact portion is configured to contact the at least one engagement portion of the engagement component, and the holding portion is configured to engage with the at least one engagement portion of the engagement component.

14. The electronic device according to claim 9, wherein the main cage comprises a first support portion, a second support portion, and a guide structure, the releasing component is slidably disposed on the first support portion, the at least one engaging structure protrudes from the first support portion, the at least one engaging structure, the second support portion, and the guide structure are respectively located at different sides of the first support portion, and the at least one engaging structure and the guide structure are located opposite to each other.

15. The electronic device according to claim 14, wherein the cage assembly further comprises a guide post protruding from the first support portion of the main cage, the bridge component comprises a through hole, and the guide post is configured to be inserted into the through hole so as to position the cage assembly to the bridge component.

16. The electronic device according to claim 14, wherein the cage assembly further comprises a riser card disposed on the second support portion.

17. The electronic device according to claim 9, further comprising a second restoring component connected to and located between the engagement component and the bridge component.

18. The electronic device according to claim 14, wherein the housing further comprises a rear wall connected to and located between the two sidewalls and has at least one receiving space configured to accommodate the guide structure of the cage assembly.

19. The electronic device according to claim 18, wherein the rear wall comprises at least one guiding structure, the at least one guiding structure defines a groove, and the guide structure comprises at least one guiding portion slidably disposed in the groove.

20. The electronic device according to claim 11, wherein the pushing portion of the releasing component is removably inserted into the pushed portion of the engagement component so as to push the pushed portion with the inclined surface.

* * * * *